United States Patent
Bae et al.

(10) Patent No.: US 8,358,729 B2
(45) Date of Patent: Jan. 22, 2013

(54) BASEBAND PHASE-LOCKED LOOP

(75) Inventors: Hyeon Min Bae, Champaign, IL (US); Naresh Ramnath Shanbhag, Champaign, IL (US); Andrew C. Singer, Champaign, IL (US)

(73) Assignee: Finisar Corporation, Sunnyvale, CA (US)

( * ) Notice: Subject to any disclaimer, the term of this patent is extended or adjusted under 35 U.S.C. 154(b) by 431 days.

(21) Appl. No.: 12/546,537

(22) Filed: Aug. 24, 2009

(65) Prior Publication Data

US 2010/0067636 A1 Mar. 18, 2010

Related U.S. Application Data

(60) Provisional application No. 61/091,148, filed on Aug. 22, 2008.

(51) Int. Cl.
 *H03D 3/24* (2006.01)
(52) U.S. Cl. ........ 375/374; 375/376; 327/155; 327/156; 327/157
(58) Field of Classification Search .......... 327/100, 327/141, 155–157; 375/354, 371, 373, 374, 375/376
See application file for complete search history.

(56) References Cited

U.S. PATENT DOCUMENTS

| | | | |
|---|---|---|---|
| 5,757,238 A * | 5/1998 | Ferraiolo et al. | 331/16 |
| 5,978,425 A * | 11/1999 | Takla | 375/374 |
| 6,070,263 A | 5/2000 | Tsui et al. | |
| 6,161,210 A | 12/2000 | Chen et al. | |
| 7,117,426 B2 | 10/2006 | Wu | |
| 7,127,664 B2 | 10/2006 | Nicol | |
| 7,131,055 B2 | 10/2006 | Mathew | |
| 7,206,363 B2 | 4/2007 | Hegde et al. | |
| 7,526,023 B1 * | 4/2009 | Shumarayev | 375/233 |
| 2001/0035994 A1 | 11/2001 | Agazzi et al. | |
| 2001/0035997 A1 | 11/2001 | Agazzi | |
| 2002/0012152 A1 | 1/2002 | Agazzi et al. | |
| 2002/0060827 A1 | 5/2002 | Agazzi | |
| 2002/0080898 A1 | 6/2002 | Agazzi et al. | |
| 2004/0076119 A1 * | 4/2004 | Aronson et al. | 370/249 |
| 2006/0284687 A1 * | 12/2006 | Abel | 331/16 |
| 2007/0153126 A1 * | 7/2007 | Sonobe | 348/537 |
| 2007/0188242 A1 * | 8/2007 | Song | 331/16 |
| 2011/0043374 A1 * | 2/2011 | Bannister et al. | 340/870.02 |
| 2011/0228834 A1 * | 9/2011 | Umayabashi et al. | 375/224 |

OTHER PUBLICATIONS

L.R. Bahl, et al., *Optimal Decoding of Linear Codes for Minimizing Symbol Error Rate*, IEEE Transactions on Information Theory, Mar. 1974, pp. 284-287.
Peter J. Black et al., *A 1-Gb/s, Four-State, Sliding Block Viterbi Decoder*, IEEE Journal of Solid-State Circuits, vol. 32, No. 6, Jun. 1997, pp. 797-805.

(Continued)

*Primary Examiner* — David C. Payne
*Assistant Examiner* — James M Perez
(74) *Attorney, Agent, or Firm* — Maschoff Gilmore & Israelsen

(57) ABSTRACT

An example method includes receiving a phase correction signal representing a phase difference between a source signal and a reference signal, generating a first control voltage from the phase correction signal using a charge pump circuit, generating a second control voltage from the phase correction signal in response to a digitally filtered version of the phase correction signal, wherein the second control voltage corrects for an offset error present in the first control voltage, calculating a VCO control signal based on a linear combination of the first and the second control voltages; and generating the source signal in response to the VCO control signal.

20 Claims, 4 Drawing Sheets

OTHER PUBLICATIONS

Peter J. Black et al., *A 140/Mb/s, 32-State, Radix-4 Viterbi Decoder*, IEEE Journal of Solid-State Circuits, vol. 27, No. 12, Dec. 1992, pp. 1877-1885.

M. Boo et al., *High-Speed Viterbi Decoder: An Efficient Scheduling Method to Exploit the Pipelining*, IEEE International Conference on Application Specific Array Processors, Aug. 19-21, 1996.

Montse Boo et al., *High-Performance VLSI Architecture for the Biterbi Algorithm*, IEEE Transactions on Communications, vol. 45, No. 2, Feb. 1997, pp. 168-176.

Henning Bulow et al., *Electronic PMD Mitigation—from Linear Equalization to Maximum-Likelihood Detection*, Alcatel Corporate Research Center, Stuttgart, Germany, 2000, pp. WAA3-1-WAA3-3.

D.G. Chinnery et al., *Achieving 550 MHz in an ASIC Methodology*, Proceedings of the 38$^{th}$ Design Automation Conference, Las Vegas, Nevada, Jun. 2001, pp. 420-425.

David Chinnery, e al., *Achieving 550 MHz in an ASIC Methodology*, Presentation, Proceedings of the 38$^{th}$ Design Automation Conference, Las Vegas, Nevada, Jun. 2001, pp. 420-425, PP presentations, pp. 1-37.

Young-bae Choi, *A VLSI Architecture for High Speed and Variable Code Rate Viterbi Decoder*, Video Resarch Center, DAEWOO Electronics Co., Ltd., Seoul Korea, pp. 1918-1922.

T. Conway, *Implementation of High Speed Viterbi Detectors*, Electronics Letters, vol. 35, No. 24, Nov. 25, 1999, pp. 2089-2090.

Gerhard Fettweis et al., *Parallel Viterbi Algorithm Implementation: Breaking the ACS-Bottleneck*, IEEE Transactions on Communications, vol. 37, No. 3, Aug. 1989, pp. 785-790.

Gerhard Fettweis et al., *Reduced-Complexity Viterbi Detector Architectures for Partial Response Signalling*, IEEE Global Telecommunications conference, Singapore, Technical Program conference Record, vol. 1, Nov. 1995, pp. 559-563.

Gerhard Fettweis et al., *High-Rate Viterbi Processor: A Systolic Array Solution*, IEEE Journal on Selected Areas in Communications, vol. 8, No. 8, Oct. 1990, pp. 1520-1534.

Gerhard Fettweis et al., *High-Speed Parallel Viterbi Decoding: Algorithm and VLSI-Architecture*, IEEE Communications Magazine, vol. 46, May 1991, pp. 46-55.

G. David Forney, Jr., *The Viterbi Algorithm*, Proceedings of the IEEE, vol. 61, No. 3, Mar. 1973, pp. 268-278.

Yukitsuna Furuya et al., *A Practical Approach Toward Maximum Likelihood Sequence Estimation for Band-Limited Nonlinear Channels*, IEEE Transactions on Communications, vol. Com-31, No. 2, Feb. 1983, pp. 200.

Warren J. Gross et al., *Difference Metric Soft-Output Detection: Architecture and Implementation*, IEEE Transactions on Circuits and Systems II (analog and Digital Signal Processing), vol. 48, No. 10, Oct. 2001, pp. 904-911.

H.F. Haunstein et al., *Design of Near Optimum Electrical Equalizers for Optical Transmission in the Presence of PMD*.

Simon Haykin, *Adaptive Filter Theory*, CES Series, 1986, pp. 8-10.

Andries P. Hekstra, *An Alternative to Metric Rescalling in Viterbi Decoders*, IEEE Transactions on Communications, vol. 37, No. 11, Nov. 1989, pp. 1220-1222.

Inyup Kang, *Low-Power Viterbi Decoder for CDMA Mobile Terminals*, IEEE Journal of Solid-State Circuits, vol. 33, No. 3, Mar. 1998, pp. 473.

Kyoung IL Kim et al., *A Digital Method of Modeling Quadratically Nonlinear Systems with a General Random Input*, IEEE Transactions on Acoustics Speech and Signal Processing, vol. 36, No. 11, Nov. 1988, pp. 1758-1769.

Edward A. Lee et al., *Digital Communication*, Second Edition, pp. 406-409.

K. J. Ray Liu et al., *Algorithm-Based Low-Power and High-Performance Multimedia Signal Processing*, Proceedings of the IEEE, vol. 86, No. 6, Jun. 1998, pp. 1155.

Howard H. Ma, *On Tail Biting Convolutional Codes*, IEEE Transactions on Communications, vol. Com 34, No. 2, Feb. 1986, pp. 104-111.

Nigel C. McGinty et al., *Equalization of Sparse ISI Channels Using Parallel Trellies*, Proceedings, GLOBECOM 1998, Nov. 1998, pp. 1-6.

Erik Paaske et al., *High Speed Viterbi Decoder Architecture*, First ESA Workshop on Tracking, Telemetry and Command Systems, ESTEC, Jun. 1998, pp. 1-8.

Keshab K. Parhi, *Pipelining and Parallel Processing*, VLSI Digital Signal Processing Systems, 1999, pp. 63-73.

Arun Raghupathy et al., *A Transformation for Computational Latency Reduction in Turbo-Map Decoding*, Proceedings of the 1999 IEEE International Symposium on Circuits and Systems, 1999, vol. 4, May 30-Jun. 2, 1999, pp. 402-405.

Samirkumar Ranpara et al., *A Low-Power Viterbi Decoder Design for Wireless Communications Applications*, Int. ASIC Conference, Sep. 1999, Washington DC, pp. 1-5.

J. S. Reeve, *A Parallel Viterbi Decoding Algorithm*, Department of Electronics and Computer Science, Southampton, UK, Jul. 21, 2000, pp. 1-11.

Patrick Robertson et al., *Optimal and Sub-Optimal Maximum a Posteriori Algorithms Suitable for Turbo Decoding*, Communication Theory, vol. 8, No. 7, Mar.-Apr. 1997, pp. 119-125.

C. Bernard Shung et al., *VLSI Architectures for Metric Normalization in the Viterbi Algorithm*, in Proc. Int. Conf. Communications, vol. 4, Apr. 1990, pp. 1723-1728.

Mike Sieben et al., *Optical Single Sideband Transmission at 10 Gb/s Using Only Electrical Dispersion Compensation*, Journal of Lightwave Technology, vol. 17, No. 10, Oct. 1999, pp. 1742-1749.

Naresh R. Shanbhag, *Algorithms Transformation Techniques for Low-Power Wireless VLSI Systems Design*, Coordinated Science Laboratory/ECE Department, Urbana, IL, pp. 1-36.

S. Summerfield, *Analysis of Convolutional Encoders and Synthesis of Rate-2/n Viterbi Decoders*, IEEE Transaction on Information Theory, vol. 42, No. 4, Jul. 1996, pp. 1280-1295.

Kou-hu Tzou et al., *Sliding Block Decoding of Convolutional Codes*, IEEE Transactions on Communications, vol. Com-29, No. 9, Sep. 1981, pp. 1401-1403.

Jack H. Winters et al., *Electrical Signal Processing Techniques in Long-Haul Fiber-Optic Systems*, IEEE Transactions on Communications, vol. 38, No. 9, Sep. 1990, pp. 1439-1453.

Alfred K. Yeung et al., *WP 5.6: A 210 Mb/s Radix-4 Bit-level Pipelined Viterbi Decoder*, ISSCC, 1995, pp. 88-89.

* cited by examiner

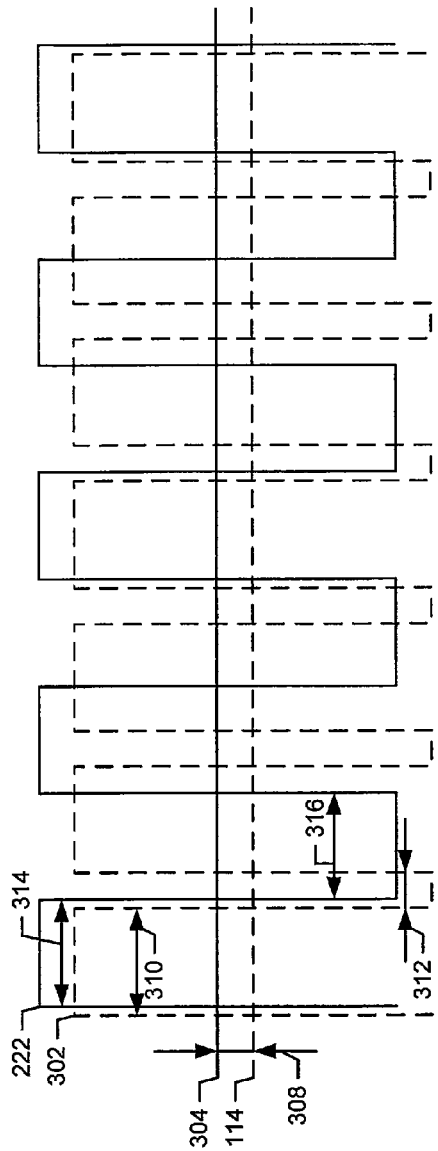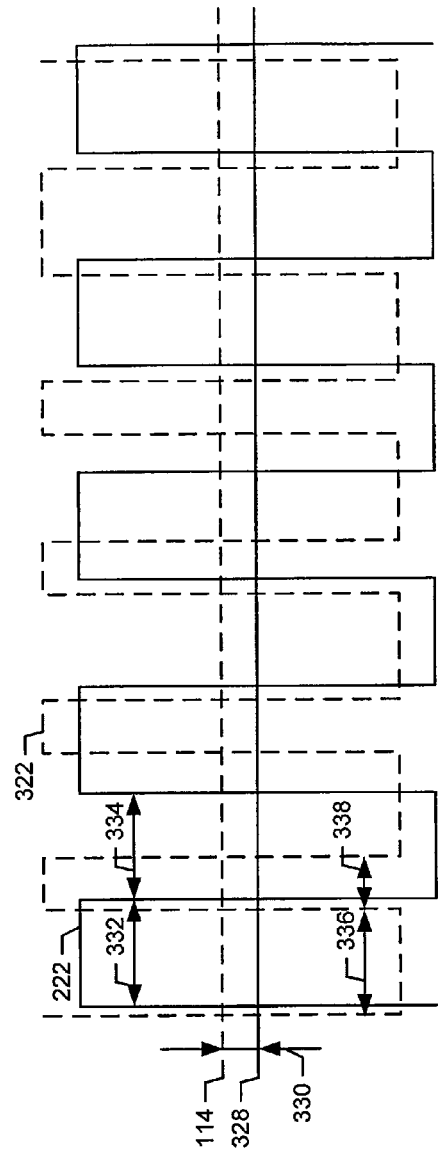

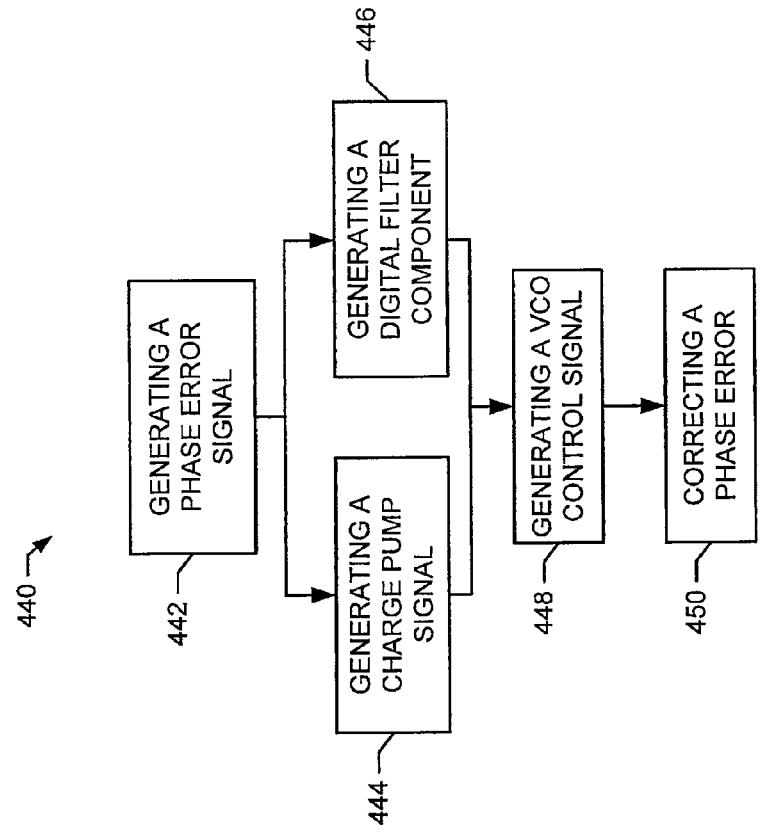
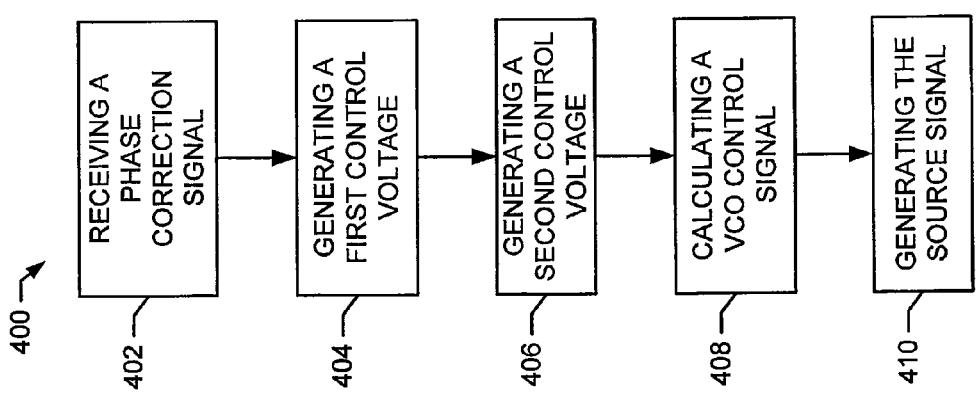

BASEBAND PHASE-LOCKED LOOP

CROSS-REFERENCE TO RELATED APPLICATIONS

The present application claims the benefit of and priority to U.S. Provisional Application Ser. No. 61/091,148, entitled "A METHOD AND APPARATUS OF IMPROVED BASEBAND PHASE-LOCKED LOOP," filed Aug. 22, 2008, which application is fully incorporated herein by reference in its entirety.

BACKGROUND

1. Field of the Invention

The present invention generally relates to phase-locked loop. More specifically, some embodiments relate to a phase-locked loop system utilizing a combination of analog and digital components.

2. Related Technology

A phase-locked loop (PLL) is a control system that generates a signal having a fixed phase relationship to a reference signal. PLLs are widely used in radio, telecommunications, computers and other electronic applications. They may generate stable frequencies, recover a signal from a noisy communication channel, or distribute clock timing pulses in digital logic designs such as microprocessors.

A typical phase-locked loop (PLL) is shown in FIG. 1. The PLL 100 receives an analog reference signal 110 and compares it to a voltage-controlled oscillator (VCO) signal 122 fed from the output, generating a phase-error signal 112 as a measure of their phase difference. If the phase or the frequency of the reference signal ($f_R$) does not equal the phase or the frequency of the VCO output ($f_{VCO}$), the phase-error signal 112, after being processed by the charge pump 104, causes $f_{VCO}$ to deviate in the direction $f_{IN}$. If conditions are right, the VCO 108 will quickly lock to $f_{IN}$, maintaining a fixed phase relationship with the reference signal 110. To increase the instantaneous response of the system, the phase-error signal 112 is run through a high bandwidth direct update circuit 120 with a constant gain and combined with the charge pump output 114.

The charge pump circuitry 104 is typically implemented as a single pole integrator. Combined with the parallel direct update path, the PLL 100 creates a two-pole linear feedback loop and has a potential to cause system instability due to the nearly 180-degree phase margin of the system. Furthermore, due to the imperfect components in the charge pump circuit 104, the integrator creates imbalances, causing errors in the VCO output. This can be problematic in 90 nm CMOS circuitries as typically implemented in modern VLSI applications.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF SOME EXAMPLE EMBODIMENTS

In general, example embodiments relate to a phase-locked loop system utilizing a combination of analog and digital components.

In one example embodiment, a method includes receiving a phase correction signal representing a phase difference between a source signal and a reference signal, generating a first control voltage from the phase correction signal using a charge pump circuit, generating a second control voltage from the phase correction signal in response to a digitally filtered version of the phase correction signal, wherein the second control voltage corrects for an offset error present in the first control voltage, calculating a VCO control signal based on a linear combination of the first and the second control voltages; and generating the source signal in response to the VCO control signal.

In some embodiments, the second control voltage may be generated by a digital to analog converter (DAC) in response to the digitally filtered version of the phase correction signal. In some embodiments, the phase correction signal is a binary signal that controls the charging and discharging of the charge pump circuit. In some embodiments, the digitally filtered version of the phase correction signal may be generated by a digital filter having an infinite impulse response (IIR), or, alternatively, a finite impulse response (FIR).

In another example embodiment, the method includes generating a VCO control signal to correct a phase error in response to a phase error signal, wherein the VCO control signal includes (i) a charge pump signal generated by a charge pump circuit in response to the phase error signal, wherein the charge pump signal includes an error component, and (ii) a digital filter component generated in response to the phase error signal by a digital filter and a digital-to-analog converter, wherein the digital filter component acts to offset the error component.

In accordance with yet another example embodiment, an apparatus includes a charge pump circuit for generating a first control voltage in response to a phase correction signal, a compensation circuit for generating a second control voltage in response to the phase correction signal, a signal summer for generating a VCO control signal based on a linear combination of the first control voltage and the second control voltage, and a voltage controlled oscillator for generating a clock signal in response to the VCO control signal.

In some embodiments, the apparatus further includes a decision circuit for generating the phase correction signal in response to a phase difference between a reference signal and the clock signal. The compensation circuit may comprise a digital filter for generating a digitally filtered signal in response to the phase correction signal. The output of the digital filter may be converted to a current or voltage signal via a digital to analog converter (DAC).

In some embodiments, the apparatus further includes a direct update circuit for generating a third control voltage in response to the phase correction signal. The direct update circuit may comprise a high-bandwidth amplifier having a predetermined gain factor in a range of 0.005 to 0.015.

These and other aspects of example embodiments will become more fully apparent from the following description and appended claims.

BRIEF DESCRIPTION OF THE DRAWINGS

To further clarify various aspects of some embodiments of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 3A is a timing diagram depicting the VCO control signal of the improved PLL and the prior art PLL when the output of the charge pump is below a desired control voltage;

FIG. 3B is a timing diagram depicting the VCO control signal of the improved PLL and the prior art PLL when the output of the charge pump is above a desired control voltage;

FIG. 4A is a flow chart of one embodiment of a method for providing improved PLL; and FIG. 4B is a flow chart of another embodiment of a method for providing improved PLL.

DETAILED DESCRIPTION

Figure 2A:
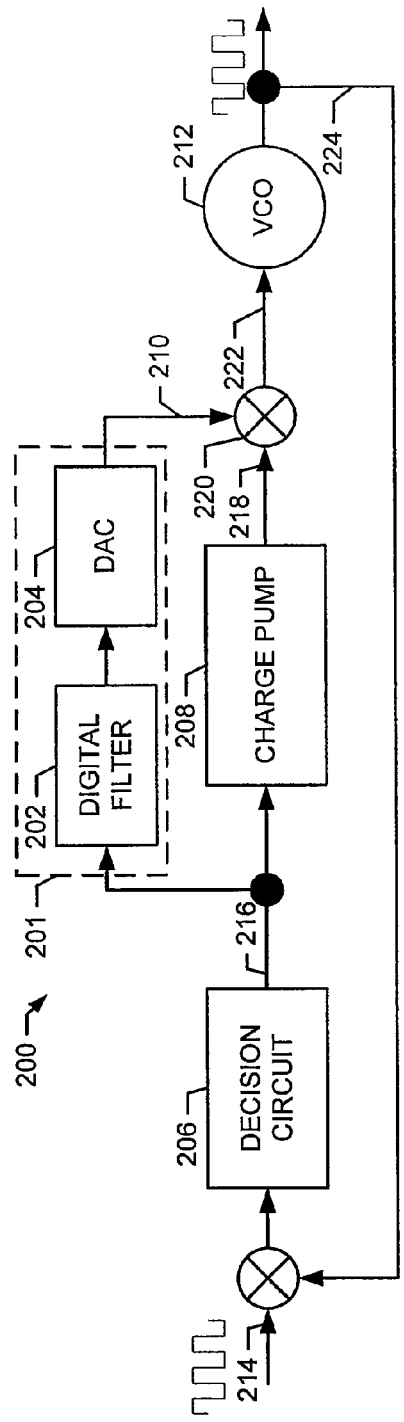
FIG. 2A is a block diagram of one embodiment of an apparatus of improved PLL.

FIG. 2A depicts a block diagram of an improved phase-locked (PLL) loop 200 in accordance with some embodiments. As shown in FIG. 2A, the improved PLL 200 includes a charge pump circuit 208, a compensation circuit 201, a signal summer 220, and a voltage-controlled oscillator (VCO) 212 producing a data signal 224 having a signal level transition.

The charge pump circuit 208 receives a phase correction signal 216 and generates a first control voltage 218. In the improved PLL 200, the charge pump acts as an integrator to generate a control voltage (the first control voltage 218) to the VCO 212 to produce a clock signal 224 in response to the received phase correction signal 216. In particular, the charge pump 208 may be implemented in the CMOS technology. For example, the charge pump 208 may include an analog differential amplifier connected to a load capacitor. The amplifier charges or discharges the load capacitor according to the received phase correction signal 216. In practice, due either to imperfect capacitors producing leaking current or to channel width modulation effects within the differential amplifier, the charge pump output signal (the first control voltage 218) may have an error component and therefore cause the VCO control signal to deviate from the desired control voltage used to produce a clock or other source signal correctly locked to the reference signal 214. Furthermore, the charge pump circuit 208 may have a potential to cause system instability in the feedback loop due to one or more inherent pole points and the small phase margin associated with the charge pump circuit. The pole points and phase margin imposed by the charge pump circuit 208 may be analyzed and estimated using those methods now known or later developed for feedback system analysis.

The improved PLL 200 also includes a compensation circuit 201 to produce a second control voltage 210. In some embodiments, the compensation circuit 201 may include a digital filter 202 and a digital-to-analog converter (DAC) 204. The digital filter 202 receives the phase correction signal 216 and outputs the filtered version of the signal to the DAC 204. The output of the DAC 204 (the second control voltage 210) is then combined with the first control voltages 218 by a signal summer 220 into a VCO control signal 222. The second control voltage 210 produced by the digital filter 202 and the DAC 204 acts to offset the error component produced by the charge pump circuit 208. The compensation circuit 201 may produce a positive or negative output in response to the received phase correction signal 216 to reduce the error component in the first control voltage 218.

In some embodiments, the digital filter 202 may be in the form of an IIR digital filter having an infinite impulse response. For example, the IIR filter 202 may be in the form of a computer program stored and executed on a general purpose microprocessor. As another example, the IIR filter 202 may be a programmable logic device (PLD) programmed to implement the IIR digital filter 202. As still another example, the IIR filter 202 may be a customized digital logic circuit integrated with the DAC 204. Furthermore, the IIR filter 202 may be a first order IIR digital filter having one zero point or a higher order IIR digital filter having a plurality of zero points. According to some embodiments, the selection of the parameters for the IIR digital filter 202 may depend on the charge pump circuit 208. The parameters are chosen such that after processed by the DAC 204, the digitally filtered signal can offset the error component of the first control voltage 218. According to another embodiment, the IIR digital filter 202 may have one or more zero points. The zero points of the IIR digital filter 202 may be used to cancel the pole points of the charge pump circuit 208 and to increase the phase margin so that the system stability of the PLL 200 is improved. The parameters of the IIR filter 202 may be determined according to the analysis and estimation of the charge pump circuit 208. As an alternative, the digital filter 202 may be a multi-tap finite impulse response filter (FIR). However, an IIR filter is simple to implement as a single tap filter with a feedback component.

The DAC 204 can receive a digital "word" from the digital filter 202 and convert it to a control voltage for combination with the first control voltage 218 from the charge pump 208.

According to still another embodiment, the improved PLL 200 may also include a decision circuit 206 for receiving the reference signal 214 and the VCO-generated clock signal 224 and generating the phase correction signal 216 in response to the reference signal 214 and the clock signal 224. The phase correction signal 216 represents phase advance or phase delay of the clock signal 224 with respect to the reference signal 214. The phase correction signal 216 may be a differential signal including two binary components. It may also be one binary signal with signal transition between a logic zero and logic one to control the charging and discharging of the charge pump circuit 208. For example, the decision circuit 206 may be in the form of a bang-bang phase detector or its variations. The decision circuit 206 may be implemented as a digital circuit using a plurality of logic gates. It may alternately or additionally be implemented as a programmable PLD or a computer program stored and executed on a general purpose microprocessor.

Figure 2B:
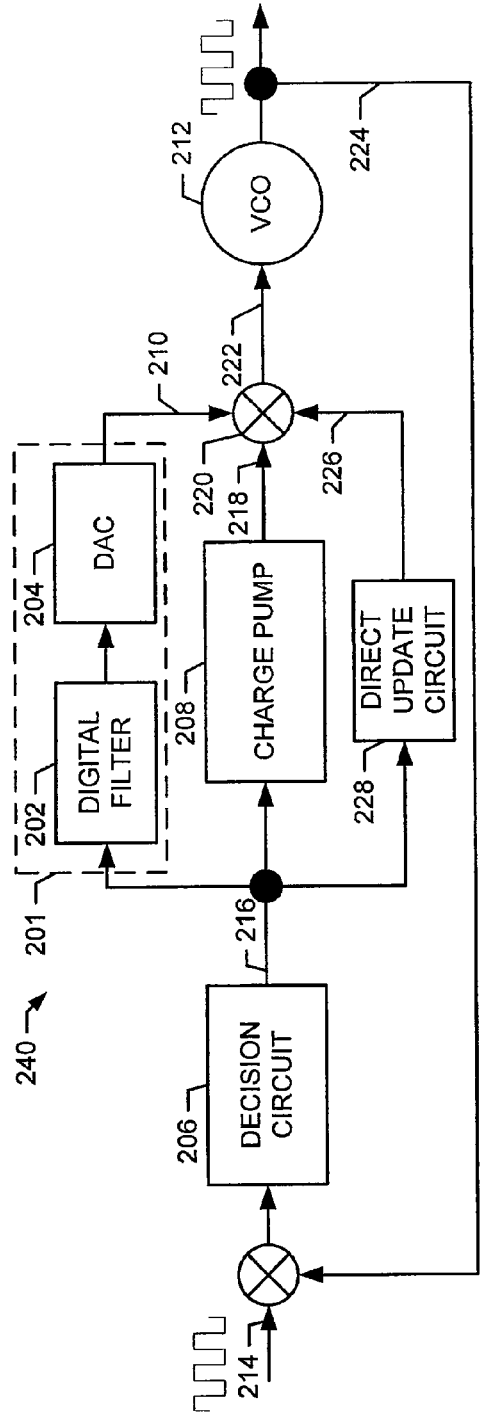
FIG. 2B is a block diagram of another embodiment of an apparatus of improved PLL.

According to another example illustrated in FIG. 2B, an improved PLL 240 may alternately or additionally include a direct update circuit 228 for receiving the phase correction signal 216 and generating a third control voltage 226. The PLL 240 of FIG. 2B is similar in some respects to the PLL 200 of FIG. 2A with some like structures. The like structures included in each of PLLs 200 and 240 are provided with like reference numbers.

In the example of FIG. 2B, the third control voltage 226 is combined with the first and second control voltages 210 and 218 to produce the VCO control signal 222. For example, the direct update circuit 228 may be a high bandwidth filter or a high bandwidth amplifier producing an instantaneous update signal (the third control voltage 226) to the VCO 212 in response to the phase correction signal 216. The filter or the amplifier may have a predetermined gain factor in a range of 0.005 to 0.015. The direct update circuit may improve the response of the PLL by causing the VCO to react rapidly to the changing relationship between the reference signal 214 and the clock signal 224. According to still another embodiment, the direct update circuit 228 may impose additional pole points to the feedback loop and therefore has a potential to increase system instability. For example, a combination of the charge pump 208 and the direct update circuit 228 may have multiple pole points and the phase margin of the combined circuit may be substantially decreased. In this embodiment, the parameters of the digital filter 202 may be chosen so that the zero points of the digital filter 202 may be used to cancel one or more pole points of the combined circuit to improve system stability. Again, the design of the digital filter 202 may depend on the analysis of the charge pump circuit 208 and the direct update circuit 228.

Figure 1:
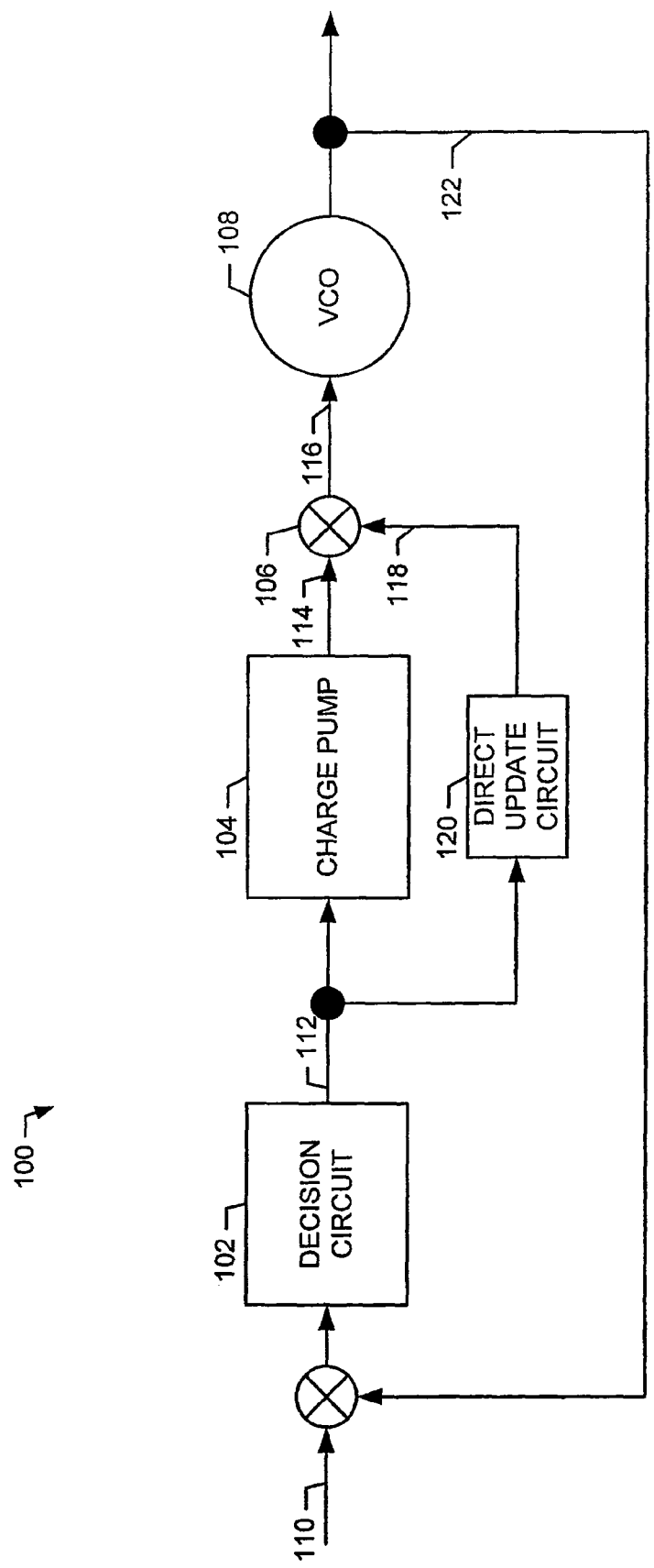
FIG. 1 is a block diagram depicting a prior art PLL.

With additional reference to FIGS. 3A and 3B, the operation of the improved PLL 240 of FIG. 2B is illustrated in comparison to the performance of the prior art PLL 100 of FIG. 1. As shown in FIG. 3A, the voltage 304 is the desired VCO control signal corresponding to the phase difference between the reference signal and the clock signal. The voltage 302 is the combination of the signal 114 and the signal 118 in the prior art PLL 100 of FIG. 1, driving the VCO 108 to adjust the phase and frequency of the VCO output in response to the phase difference. Due to the errors in the charge pump 104, the charge pump output voltage (the signal 114) is lower than the desired control voltage and thus includes an error component 308. In order to maintain the average voltage of the combined signal 302 at the level of desired control signal 304, the positive pulses 310 produced by the direct updated circuit 120 has therefore a greater time interval than does the negative pulses 312. These imbalanced ups and downs cause increased idling jitter and imbalanced lock-in range in the PLL system 100.

As further shown in FIG. 3A, the VCO control signal 222 in the improved PLL 240 is the summation of the first control voltage 218 generated by the charge pump 108, the second control voltage 210 generated by the compensation circuit 201, and the third control voltage 226 generated by the direct update circuit 228. In the improved PLL 240, the error component 308 in the charge pump output signal (the first control voltage 218) is offset by the output (the second control voltage 210) of the compensation circuit 201. The summation of the first control voltage 218 and the second control voltage 210 is substantially equal to the desired VCO control voltage 304. As the error of the combined signal is reduced, the positive pulses 314 and the negative pulses 316 produced by the direct update circuit 228 now have substantially balanced time intervals and the idling jitter is reduced.

Now turning to FIG. 3B, in the prior art PLL 100, the leaky integrator causes an error component 330 in the output signal 114 of the charge pump 104. Since the output signal 114 is higher than the signal level of the desired VCO control signal 328, the positive pulses 338 generated by the direct update circuit 120 has a smaller time interval than does the negative pulses 336, therefore causing increased idling jitter and imbalanced lock-in range.

On the other hand, as further shown in FIG. 3B, in the improved PLL 240, the error component 330 in the charge pump output signal (the first control voltage 218) is offset by the output (the second control voltage 210) of the compensation circuit 201. The summation of the first control voltage 218 and the second control voltage 210 is substantially equal to the desired VCO control voltage 328. As the error of the combined signal is substantially reduced, the positive pulses 332 and the negative pulses 334 produced by the direct update circuit 228 now have substantially balanced time intervals and therefore the idling jitter is reduced.

FIG. 4A depicts one example embodiment of a method for providing an improved PLL. As shown, the method 400 includes receiving a phase correction signal representing a phase difference between a source signal and a reference signal (block 402), generating a first control voltage from the phase correction signal using a charge pump circuit (block 404), generating a second control voltage from the phase correction signal in response to a digitally filtered version of the phase correction signal, wherein the second control voltage corrects for an offset error present in the first control voltage (block 406), calculating a VCO control signal based on a linear combination of the first and the second control voltages (block 408), and generating the source signal in response to the VCO control signal (block 410).

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

According to some embodiments, the charge pump in the method 400 may be an analog amplifier driving a load capacitor. The charge pump may be modeled as having a leaking current as the charge pump is charged or discharged, therefore causing the error present in the first control voltage. The charging and discharging of the charge pump circuit in method 400 is controlled by the phase correction signal according to the phase difference between the source signal and the reference signal.

According to some embodiments, the phase correction signal is a binary signal, generated by a decision circuit. The decision circuit is preferably a phase detector such as a bang-bang phase detector or its variations. The phase correction signal may be a differential signal having two binary components representing the phase relationship between the reference signal and the source signal. Alternatively, the phase correction signal may include only one binary component representing the advance or delay of the source signal with response to the reference signal.

According to another embodiment, the source signal is a data signal having signal level transitions. The signal level transitions define a phase of the source signal. The VCO control signal may be increased or decreased in response to a phase correction signal so that the phase of the source signal is advanced or delayed.

The method 400 may further include generating a third control voltage from the phase correction signal using a direct update circuit having a predetermined gain factor. The direct update circuit is preferably a high bandwidth filter or amplifier with a predetermined gain factor in a range of 0.005 to 0.015.

According to still another embodiment, the second control voltage is generated by a digital-to-analog converter (DAC) in response to the digitally filtered version of the phase correction signal. The DAC preferably receives a digital "word" from the filter and converts it to a voltage for combination with the first control voltage. The digitally filtered version of the phase correction signal may in turn be generated by a digital filter such as an IIR filter having an infinite impulse response. The parameters of the IIR filter may be chosen such that the second control voltage acts to offset the error present in the first control voltage generated by the charge pump circuit.

FIG. 4B depicts another embodiment of a method for providing an improved PLL. According to the embodiment, the method 440 comprises generating a VCO control signal (block 448) to correct a phase error (block 450) in response to a phase error signal (block 442), wherein the VCO control signal includes (i) a charge pump signal generated by a charge pump circuit in response to the phase error signal, wherein the charge pump signal includes an error component (block 444), and (ii) a digital filter component generated in response to the phase error signal by a digital filter and a digital-to-analog converter, wherein the digital filter component acts to offset the error component (block 446).

According to another embodiment, the charge pump signal and the digital filter component are preferably generated in parallel. The error component in the charge pump signal may be caused by a "leaky" integrator. The digital filter signal offsets the error component by increasing the VCO control signal when a negative error component is present and decreasing the VCO control signal when a positive error component is present.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
receiving a first phase correction signal representing a phase difference between a source signal and a reference signal;
generating a first control voltage from the first phase correction signal using a charge pump circuit;
generating a third control voltage, the combination of the first control voltage and the third control voltage including an offset error component due to time interval imbalances of the third control voltage;
generating a second control voltage from the first phase correction signal in response to a digitally filtered version of the phase correction signal, wherein the second control voltage corrects for the offset error by balancing the time interval imbalances, wherein the first control voltage is generated in parallel with the second control voltage from the first phase correction signal;
calculating a VCO control signal based on a linear combination of the first control voltage, the third control voltage, and the second control voltage by summing the first control voltage, the third control voltage, and the second control voltage; and
generating the source signal in response to the VCO control signal.

2. The method of claim 1, wherein the second control voltage is generated by a digital-to-analog converter (DAC) in response to the digitally filtered version of the first phase correction signal.

3. The method of claim 1, wherein the first phase correction signal is a binary signal that controls charging and discharging of the charge pump circuit.

4. The method of claim 1, wherein the linear combination of the first and second voltages is formed by a signal summer.

5. The method of claim 1, wherein the source signal is a data signal having signal level transitions.

6. The method of claim 1, wherein the digitally filtered version of the first phase correction signal is generated by a digital filter having an infinite impulse response.

7. The method of claim 1, wherein the third control voltage is generated by a direct update circuit having a predetermined gain factor.

8. An apparatus comprising:
a direct update circuit generating a third control voltage in response to a first phase correction signal, the third control voltage including positive pulses and negative pulses;
a charge pump circuit generating a first control voltage in response to the first phase correction signal, the combination of the first control voltage and the third control voltage including an error signal produced by imbalanced time intervals of the positive pulses and the negative pulses;
a compensation circuit generating a second control voltage in response to the first phase correction signal which balances the time interval imbalances of the positive pulses and the negative pulses, wherein the apparatus is configured such that the charge pump circuit and compensation circuit generate the first control voltage and the second control voltage in response to the same first phase correction signal in parallel;
a signal summer summing the first control voltage, the second control voltage, and the third control voltage and generating a VCO control signal based on a linear combination of the first control voltage, the second control voltage, and the third control signal; and
a voltage controlled oscillator generating a clock signal in response to the VCO control signal.

9. The apparatus of claim 8, further comprising a decision circuit for generating the first phase correction signal in response to a phase difference between a reference signal and the clock signal.

10. The apparatus of claim 8, wherein the compensation circuit further comprises a digital filter for generating a digitally filtered signal in response to the first phase correction signal.

11. The apparatus of claim 10, wherein the compensation circuit further comprises a digital-to-analog converter (DAC) for generating the second control voltage in response to the digitally filtered signal.

12. The apparatus of claim 10, wherein the digital filter has an infinite impulse response.

13. The apparatus of claim 8, wherein the direct update circuit comprises a high-bandwidth amplifier having a predetermined gain factor in a range of about 0.005 to about 0.015.

14. The apparatus of claim 8, wherein the compensation circuit comprises:
a digital filter having an infinite impulse response for generating a digitally filtered signal in response to the first phase correction signal; and
a digital-to-analog converter (DAC) for generating the second control voltage in response to the digitally filtered signal,
wherein parameters of the digital filter are selected depending on the charge pump circuit.

15. The apparatus of claim 14, wherein the digital filter includes a plurality of zero points selected to cancel the pole points of the charge pump circuit.

16. The apparatus of claim 8, wherein the direct update circuit comprises a high-bandwidth amplifier.

17. A method comprising:
generating a VCO control signal to correct a phase error in response to a phase error signal, wherein the VCO control signal is generated by summing a charge pump signal and a digital filter component signal to form a linear combination thereof, wherein the VCO control signal includes:
positive pulses and negative pulses generated by a direct update circuit;

the charge pump signal generated by a charge pump circuit in response to the phase error signal, wherein the combination of the charge pump signal and the positive pulses and the negative pulses includes an error component produced by imbalanced time intervals of the positive pulses and the negative pulses; and the digital filter component signal generated in response to the phase error signal by a digital filter and a digital-to-analog converter, wherein the digital filter component signal acts to offset the error component by balancing the imbalanced time intervals of the positive pulses and the negative pulses.

18. The method of claim 17, wherein the digital filter has an infinite impulse response.

19. The method of claim 17, wherein the phase error signal is generated by a decision circuit from a reference signal and a VCO output signal and the phase error is a difference between the reference signal and the VCO output signal.

20. The method of claim 17, wherein the phase error signal is a binary signal that controls the charging and discharging of the charge pump circuit.

* * * * *